United States Patent [19]
Mori et al.

[11] Patent Number: 5,517,208
[45] Date of Patent: May 14, 1996

[54] LIQUID CRYSTAL APPARATUS

[75] Inventors: Hideo Mori; Hisao Tajima, both of Yokohama; Hiroshi Takabayashi, Kawasaki; Toshiaki Itazawa, Yamato; Masanori Takahashi; Kenji Niibori, both of Chigasaki, all of Japan

[73] Assignee: Canon Kabushiki Kaisha, Tokyo, Japan

[21] Appl. No.: 523,167

[22] Filed: Sep. 5, 1995

Related U.S. Application Data

[62] Division of Ser. No. 166,872, Dec. 15, 1993, abandoned.

[30] Foreign Application Priority Data

Dec. 26, 1992 [JP] Japan ..................................... 4-359313
Dec. 26, 1992 [JP] Japan ..................................... 4-359316

[51] Int. Cl.⁶ ..................................................... G04G 3/36
[52] U.S. Cl. ................................................ 345/87; 361/204
[58] Field of Search .................................... 361/749, 789; 345/87, 204

[56] References Cited

U.S. PATENT DOCUMENTS

| | | | |
|---|---|---|---|
| 4,418,239 | 11/1983 | Larsen et al. | 361/749 X |
| 4,580,018 | 4/1986 | Yoshihara | 200/5 |
| 4,680,675 | 7/1987 | Sato | 361/749 X |
| 5,025,348 | 6/1991 | Suzuki et al. | 361/398 |
| 5,099,393 | 3/1992 | Bentlage et al. | 361/749 X |
| 5,100,492 | 3/1992 | Kober et al. | 361/749 X |
| 5,161,009 | 11/1992 | Tanoi et al. | 361/749 X |

FOREIGN PATENT DOCUMENTS

| | | |
|---|---|---|
| 0399372 | 11/1990 | European Pat. Off. |
| 2116370 | 9/1983 | United Kingdom. |
| 0508137 | 10/1992 | WIPO. |

OTHER PUBLICATIONS

Patent Abstracts of Japan, vol. 15, No. 430 (P-1270) 31 Oct. 1991 & JP-A-03 177 884 (Hitachi) 1 Aug. 1991 *abstract*.

Patent abstracts of Japan, vol. 13, No. 152 (P-856) (3500), Apr. 13, 1989 & JP-A-63 313 128 (Hitachi), Dec. 21, 1988.

Patent abstracts of Japan, vol. 15, No. 20 (P-1154), Jan. 17, 1991 & JP-A-02 264 223 (Matsushita Electric), Oct. 29, 1990.

Patent abstracts of Japan, vol. 17, No. 109 (P-1497), Mar. 5, 1993 & JP-A-04 298 717 (Mitsubishi Electric), Oct. 22, 1992.

Patent Abstracts of Japan, vol. 16, No. 193 (P-1349) 11 May 1992 & JP-A-04 027 929 (Matsushita Electric) 30 Jan. 1992 *abstract*.

Patent Abstracts of Japan, vol. 16, No. 222 (P-1349) 25 May 1992 & JP-A-04 046 376 (Canon) 17 Feb. 1992 *abstract*.

*Primary Examiner*—Ulysses Weldon
*Attorney, Agent, or Firm*—Fitzpatrick, Cella, Harper & Scinto

[57] ABSTRACT

A liquid crystal apparatus is constituted by a display device for data display, a drive circuit unit for driving the display device, a unit substrate for supplying electric signals to the drive circuit unit, and a tape-form film carrier comprising an insulating substrate and a conductor covered with the insulating substrate for connecting the display device, the drive circuit unit and the unit substrate. A part of the film carrier is provided with a blank portion where the insulating substrate is locally removed to absorb a stress applied to the film carrier. A unit substrate constituting the drive circuit unit is screwed to a supporting member so as to allow a movement thereof relative to the supporting member by use of a space regulating means surrounding the screw shank.

3 Claims, 10 Drawing Sheets

LIQUID CRYSTAL APPARATUS

This application is a division of application Ser. No. 08/166,872 filed Dec. 15, 1993, now abandoned.

FIELD OF THE INVENTION AND RELATED ART

The present invention relates to a liquid crystal apparatus including a display device, a drive circuit unit and a bus substrate (unit substrate) connected with a film carrier.

Figure 8:
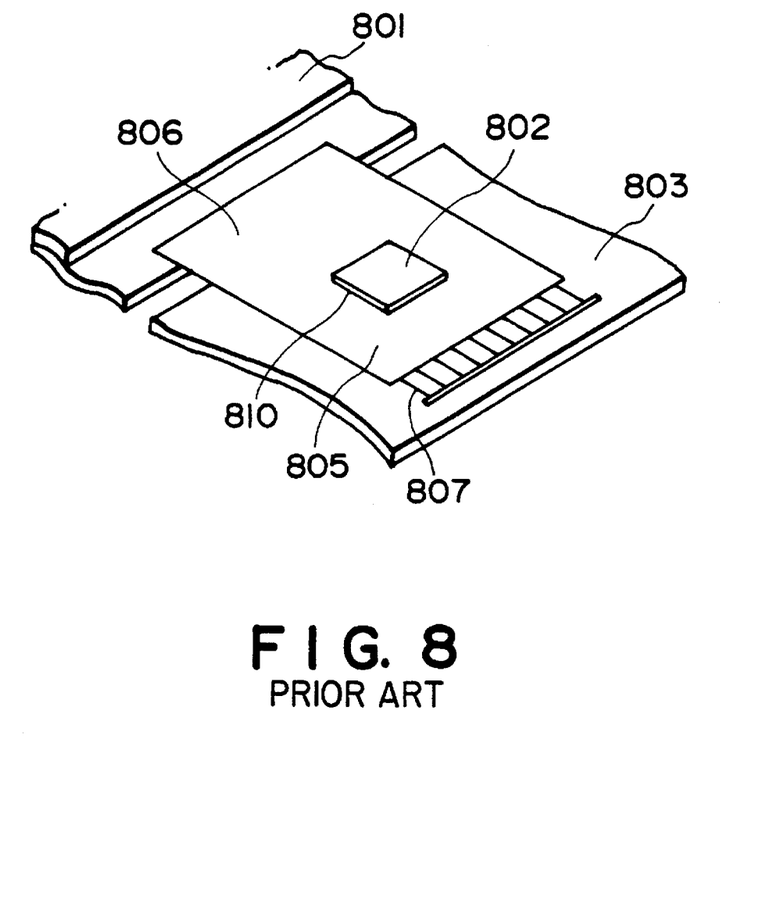
FIG. 8 is a perspective view showing a conventional joint structure among a display device, a drive circuit and a bus substrate.
Figure 9:
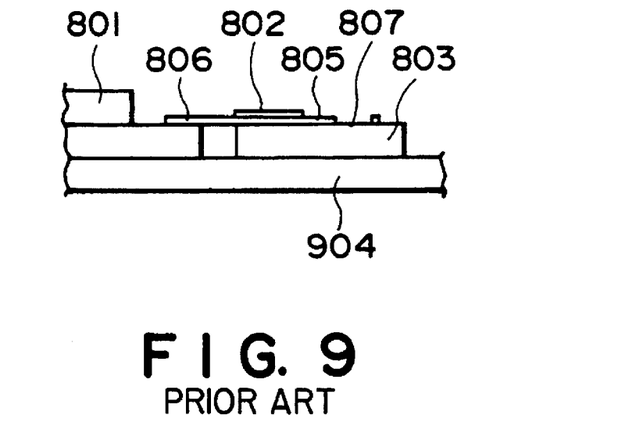
FIG. 9 is a sectional view corresponding to FIG. 8.

Hitherto, a display device has been driven by, e.g., an external drive circuit unit as schematically illustrated in FIG. 8. More specifically, a drive circuit 802 and a bus substrate (unit substrate) 803 supplying electricity and signals to the drive circuit 802 constitute a module which is fixed to a chassis 904 as shown in FIG. 9. The bus substrate 803 is electrically and mechanically connected with a flexible film carrier (flexible bus tape) 805 at an input-side outer lead part 807 and a display device 801 is electrically and mechanically connected with the film carrier 805 at an output-side outer lead part 806. The film carrier 805 is loaded with the drive circuit 802.

When the structure is supplied with an external vibration or impact, the relative position between the display device 801 and the bus substrate 803 is changed so that a stress is concentrated at the input-side outer lead part 807 and the output-side outer lead part 806 of the film carrier 805, thus causing disconnection, etc. In order to obviate the difficulty, it has been proposed to absorb a stress by forming a stepwise forming part 1008 at a part of the input-side outer lead 807 of the film carrier 805 as shown in FIG. 10, or to form a blank 1109 of a film substrate (insulating substrate) between the inner lead 810 and the output-side outer lead 806 of the film carrier 805, so as to facilitate bending thereat as a fulcrum for absorbing the stress as shown in FIG. 11.

Figure 10:
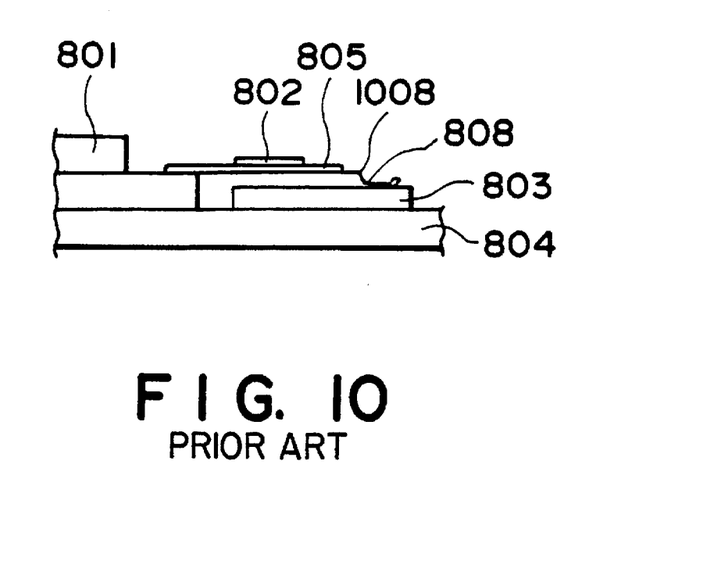
FIG. 10 is a perspective view showing another conventional joint structure among a display device, a drive circuit and a bus substrate.

According to the structure shown in FIG. 10, however, a large change in relative position results between the display device 801 and the bus substrate 803 when the display device 801 in a large size is supplied with a thermal impact, because the display device 801 and the chassis 804 generally have different thermal expansion coefficients, so that the amount of deformation cannot be absorbed only by the stepwise forming part 1008 which is formed at a part of the input-side outer lead 807.

Figure 11:
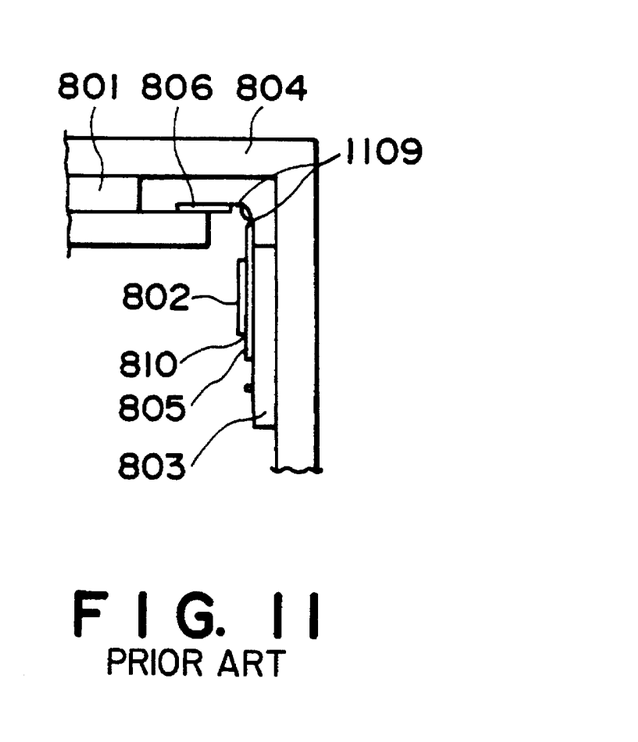
FIG. 11 is a sectional view corresponding to FIG. 10.

In case of the structure shown in FIG. 11 on the other hand, the part of a copper foil exposed by the blank 1109 of the film substrate is liable to crack at the time of bending, thus remarkably lowering the strength of the film carrier 805, so that the handling has required utmost care.

Figure 18:
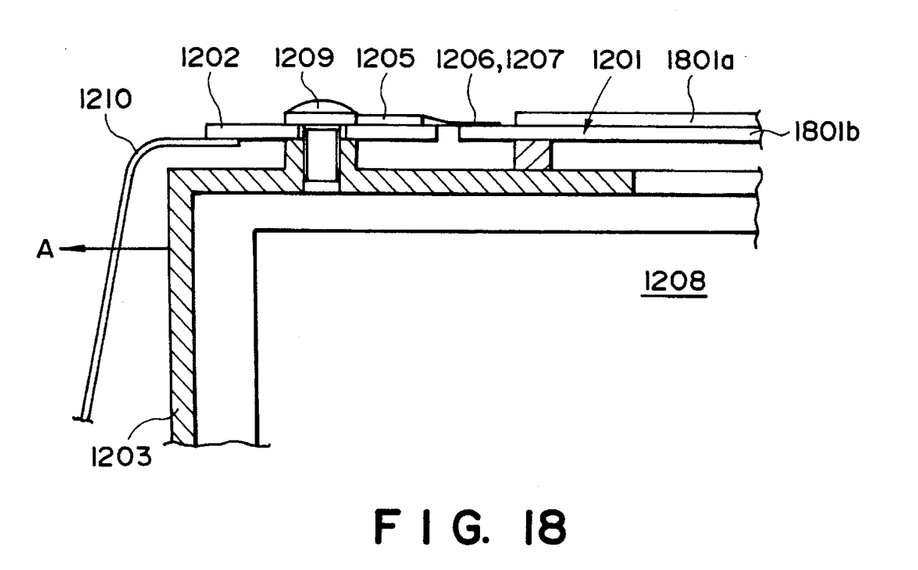
FIG. 18 is a partial sectional view showing a conventional joint structure for a liquid crystal drive substrate.

Incidentally, in a conventional liquid crystal apparatus, the bus substrate (unit substrate) has been fixed to a panel (display device)-fixing member has been effected, for example, as illustrated in FIG. 18. Referring to the figure, a panel 1201 is fixed to a panel-fixing member 1203 with an adhesive of, e.g., silicone rubber, and a bus substrate (unit substrate) 1202 is fixed to the panel-fixing member 1203 with screws 1209, etc.

The panel 1201 generally comprises a pair of glass substrates 1801a and 1801b each provided with transparent electrodes (not shown) and a liquid crystal (not shown) sealed between the glass substrates, so as to apply drive voltages to the transparent electrodes for driving the liquid crystal. Further, a drive IC 1205 for controlling drive signals mounted on a film carrier 1206 (TAB film) is electrically connected to the bus substrate 1202 and the panel 1201 via the lead 1207 of the film carrier by the outer-lead-bonding method. Behind the panel 1201 is disposed a backlight 1208 for illuminating the panel 1201. The bus substrate 1202 and a CPU substrate (not shown) for controlling the entire liquid crystal apparatus are electrically connected via a flat cable 1210.

In the above-described conventional structure, however, the bus substrate 1202 and the panel fixing member 1203 are integrally fixed, so that a stress is directly applied to the joint of the lead 1207 of the film carrier 1206, thus resulting in a difficulty, such as breakage of the lead of the film carrier 1206.

Figure 19:
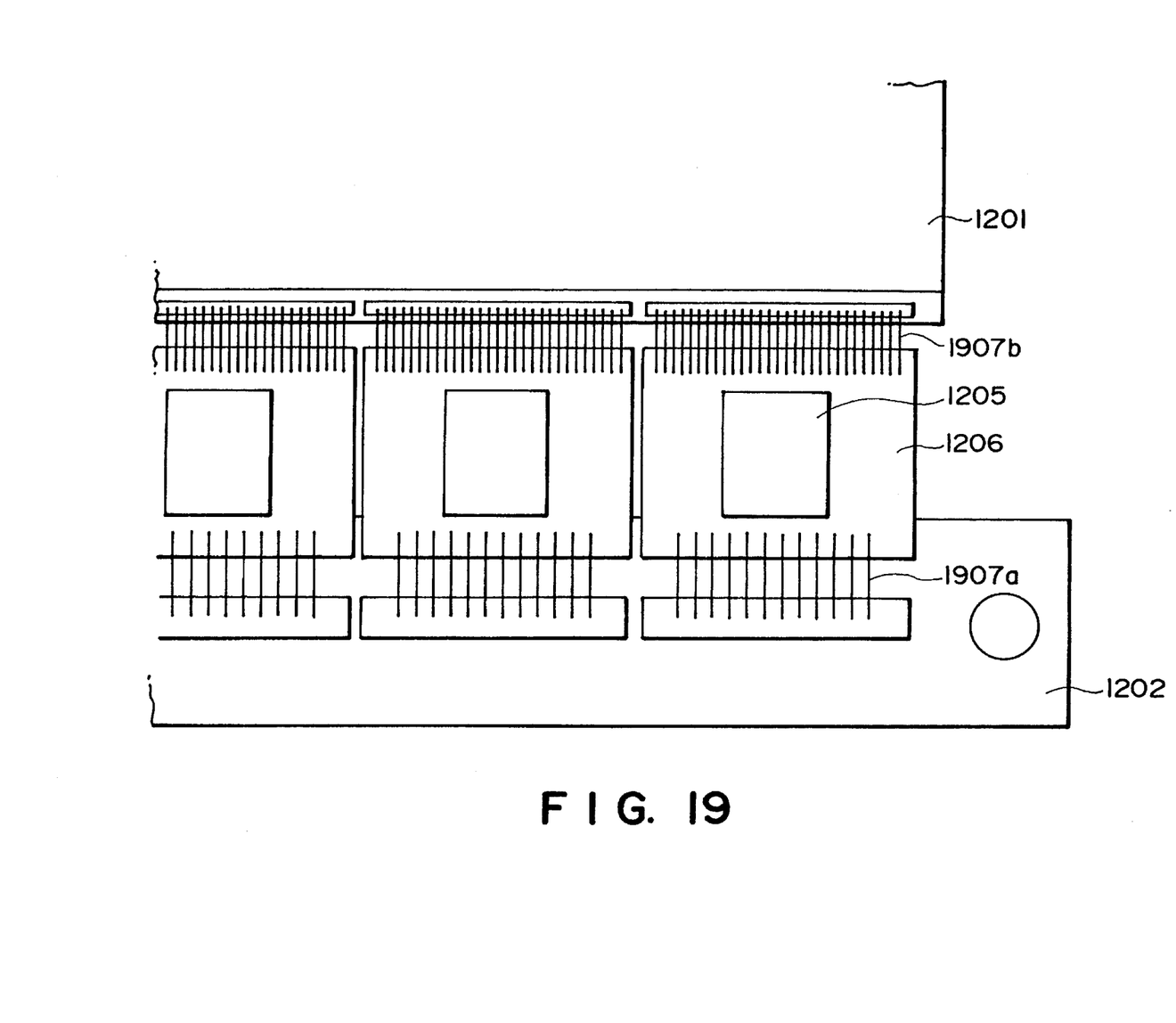
FIG. 19 is a partial plan view corresponding to FIG. 18.

FIG. 19 is an enlarged view of the joints between the film carrier 1206 and the panel 1201 and the bus substrate 1202. The lead 1907a of the film carrier 1206 and the bus substrate 1202 are jointed at a pitch of ordinarily 0.3–1 mm, and the lead 1907b of the film carrier 1206 and the panel 1201 are jointed at a narrower pitch of about 0.1–0.3 mm. In this arrangement, the leads 1907b of the film carrier 1206 become thin and are liable to be broken at a small force.

The panel 1201 is ordinarily composed by glass and the panel-fixing member 1203 is frequently composed by a plastic material, so that there is a remarkable difference in thermal expansion coefficient therebetween. For example, when the structure shown in FIG. 18 is subjected to an increase in environmental temperature, the panel fixing member 1203 may be elongated, whereas the panel 1201 having a remarkably smaller thermal expansion coefficient may not be substantially elongated. As a result, the panel fixing member 1203 moves in a direction of an arrow A, whereas the movement of the panel 1201 can be substantially negligible. The bus substrate 1202 is integrally fixed to the panel-fixing member 1203 with screws and is therefore moved along with the elongation of the panel-fixing member 1203. As a result, a mechanical stress is concentrated at the mechanically weak lead 1207 of the film carrier 1206 between the moving bus substrate 1202 and the non-moving panel 1201. Particularly, along with recent trend of the remarkable increase in size of liquid crystal display device resulting in a remarkable size change due to a change in environmental temperature, the above-mentioned fixing structure cannot cope with such a remarkable size change.

SUMMARY OF THE INVENTION

In view of the above-mentioned problems of the conventional liquid crystal apparatus, an object of the present invention is to provide a liquid crystal apparatus including a film carrier which is capable of facilitating the assembling of the apparatus and yet is tough against an external stress.

Another object of the present invention is to provide a liquid crystal apparatus including a film carrier capable of decreasing the stress applied to leads thereof even when a positional deviation is caused between the panel and the panel fixing member due to a difference in thermal expansion coefficient.

According to the present invention, there is provided a liquid crystal apparatus, comprising: a display device for data display, a drive circuit unit for driving the display device, a unit substrate for supplying electric signals to the drive circuit unit, and a tape-form film carrier comprising an insulating substrate and a conductor covered with the insulating substrate for connecting the display device, the drive circuit unit and the unit substrate, wherein a part of the film carrier connecting the display device and the drive circuit unit is provided with a first blank portion where the insulating substrate is locally removed to expose the conductor and absorb a stress externally applied to the film carrier, and/or a part of the film carrier connecting the drive circuit unit and the unit substrate is provided with a second blank portion where the insulating substrate is locally removed to expose the conductor and absorb a stress externally applied to the film carrier.

The drive circuit unit and the unit substrate may be connected with the film carrier at a lateral part of the tape-form film carrier with respect to a longitudinal direction in which the display device and the drive circuit unit are connected.

At least one of said first and second blank portion may be coated with a polyimide in a thickness of about 30–40 μm.

According to a second aspect of the present invention, there is provided a liquid crystal apparatus, comprising: a display device for data display, a unit substrate for supplying electric signals, and a film carrier loaded with a drive IC for driving the display device and connecting the display device and the unit substrate, wherein said unit substrate has a fixing hole and is fastened to a supporting member with a screw having a head and a shank inserted through the fixing hole, and a space regulating means is disposed between the screw head and the unit substrate so as to leave a spacing between the screw shank and the unit substrate, thereby providing an allowance for movement of the unit substrate relative to the supporting member.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

First Embodiment

Figure 1:
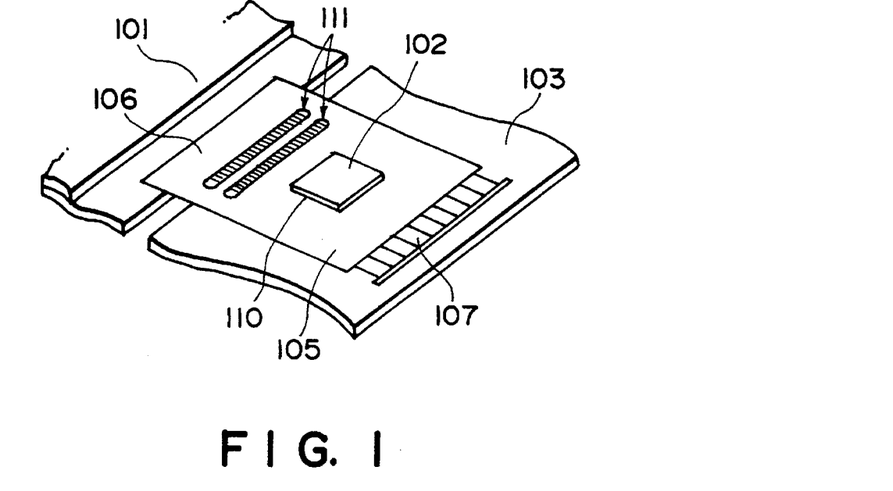
FIG. 1 is a perspective view showing a first embodiment of the joint structure used in the liquid crystal apparatus according to the invention.

FIG. 1 is a partial sectional view of a first embodiment of the present invention showing a manner of assembling an external drive circuit with a display device. Referring to FIG. 1, a tape-form film carrier 105 mounted with a drive circuit 102 is provided with a blank (film-removed part, referred to as a first blank) 111 at two parts between an inner lead 110 and an output-side outer lead 106 thereof. The blanks 111 are formed by punching at an early stage of preparation of the film carrier 105 similarly as a device hole for mounting the drive circuit 102 and input-side outer leads 107. Alternatively, it is also possible to form such blanks by etching of a film carrier formed from, e.g., a photosensitive polyimide.

Figure 2:
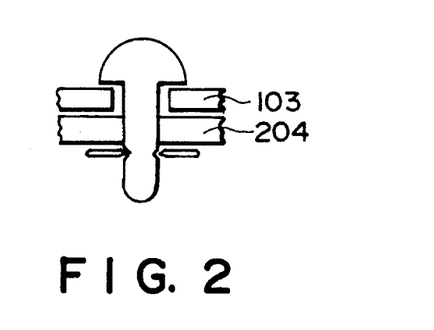
FIG. 2 is a partial sectional view of a fixing structure of a bus substrate according to the first embodiment.

The output-side outer leads 106 of the film carrier 105 are electrically and mechanically connected to electrodes of a display device 101 via, e.g., an anisotropic conductor film. The input-side outer leads 107 are electrically and mechanically connected to a substrate, e.g., by soldering. The display device 101 is fixed to a chassis 204, e.g., by bonding, and the bus substrate 103 is half-fixed to the chassis in a manner as shown in FIG. 2.

When such a module is supplied with an external impact or vibration, the bus substrate 103 is moved so that the film carrier 105 is supplied with a stress. However, the stress can be relaxed by the blanks 111 provided to the film of the film carrier 105 without forming a stepwise forming part 1008 as shown in FIG. 10, which, if formed, is liable to cause an unnecessary deformation of the bus substrate 103 (corresponding to "803" in FIG. 10). Accordingly, it is possible to obviate the damage of the drive circuit 2 and electric wires.

Figure 3:
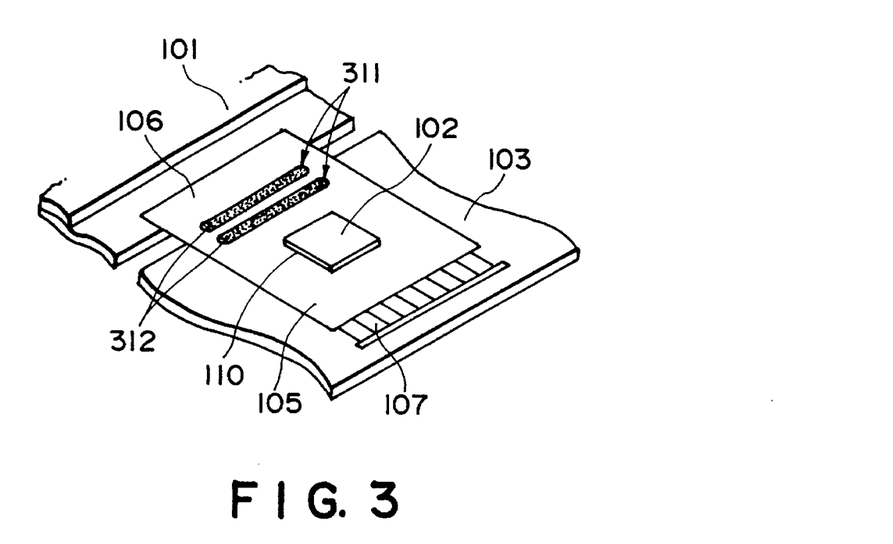
FIGS. 3–6 are respectively a perspective view showing another embodiment of the joint structure according to the invention.
Figure 4:
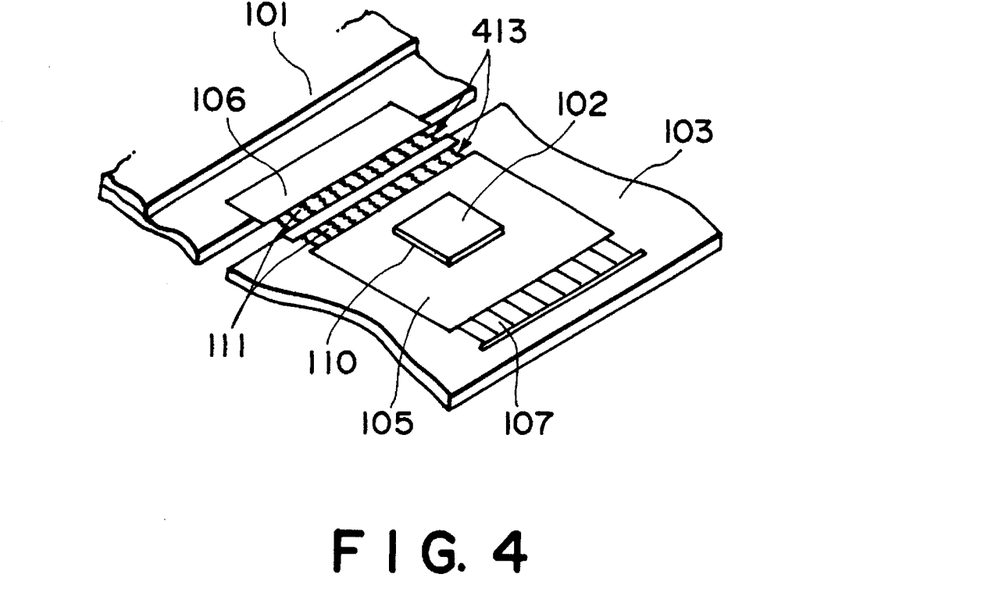

Further, as shown in FIG. 3, it is also possible to apply, e.g., a polyimide layer 312 in a thickness of ca. 30–40 μm at film blanks 311 so as to facilitate the handling without impairing the stress relaxation effect. Further, by forming the copper foils (conductors) 413 at the blanks 111 in the shape of lightning or snakes as shown in FIG. 4, it is also possible to enhance the stress relaxation effect.

Second Embodiment

Figure 5:
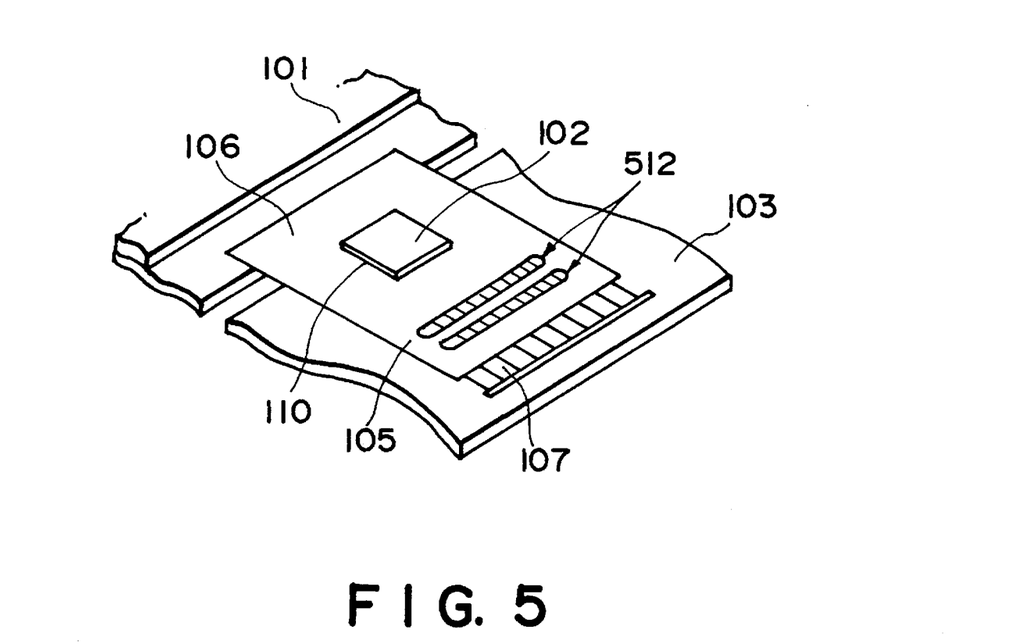

FIG. 5 is a perspective view showing a joint structure used in a liquid crystal apparatus according to the present invention for assembling an external drive circuit with a display device. In this embodiment, a film carrier 105 mounted with a drive circuit 102 is provided with blanks 512 (second blanks) of film substrate at two parts between an inner lead 110 and an input-side outer lead 107.

This embodiment may show an effect of relaxing an external stress similarly as the first embodiment, so as to prevent the damage of the drive circuit 102 and electric wires.

Third Embodiment

Figure 6:
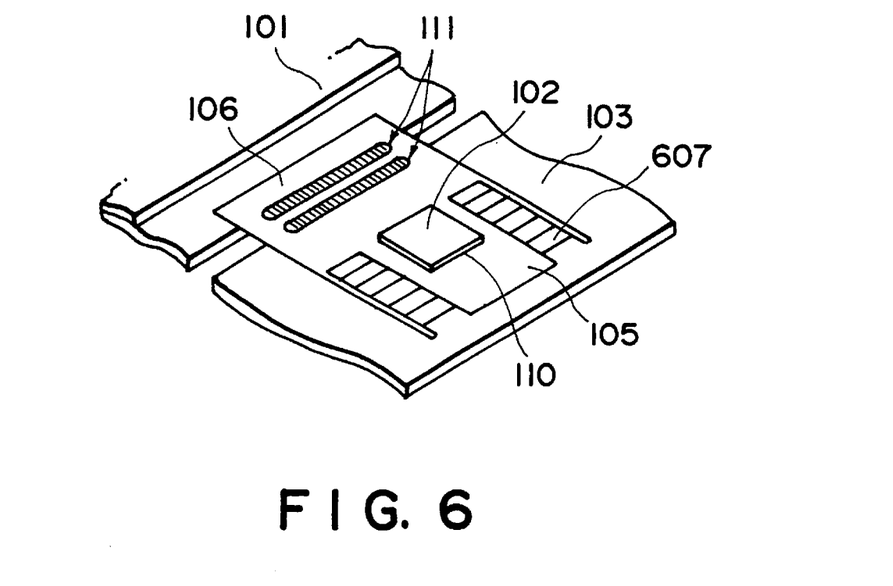

FIG. 6 is a perspective view showing a third embodiment of assembling an external drive circuit with a display device. In this embodiment, input-side inner leads 607 of a film carrier 105 mounted with a drive circuit 102 are disposed to extend in a direction perpendicular to a direction toward output-side outer leads 106 and the display device 101.

By this embodiment, the film carrier 105 and the bus substrate 103 are firmly connected to each other to suppress the movement of the bus substrate 103. This is particularly effective for a large-sized display device, such as one having a diagonal size in excess of 20 inches, requiring a large and heavy bus substrate.

Fourth Embodiment

Figure 7:
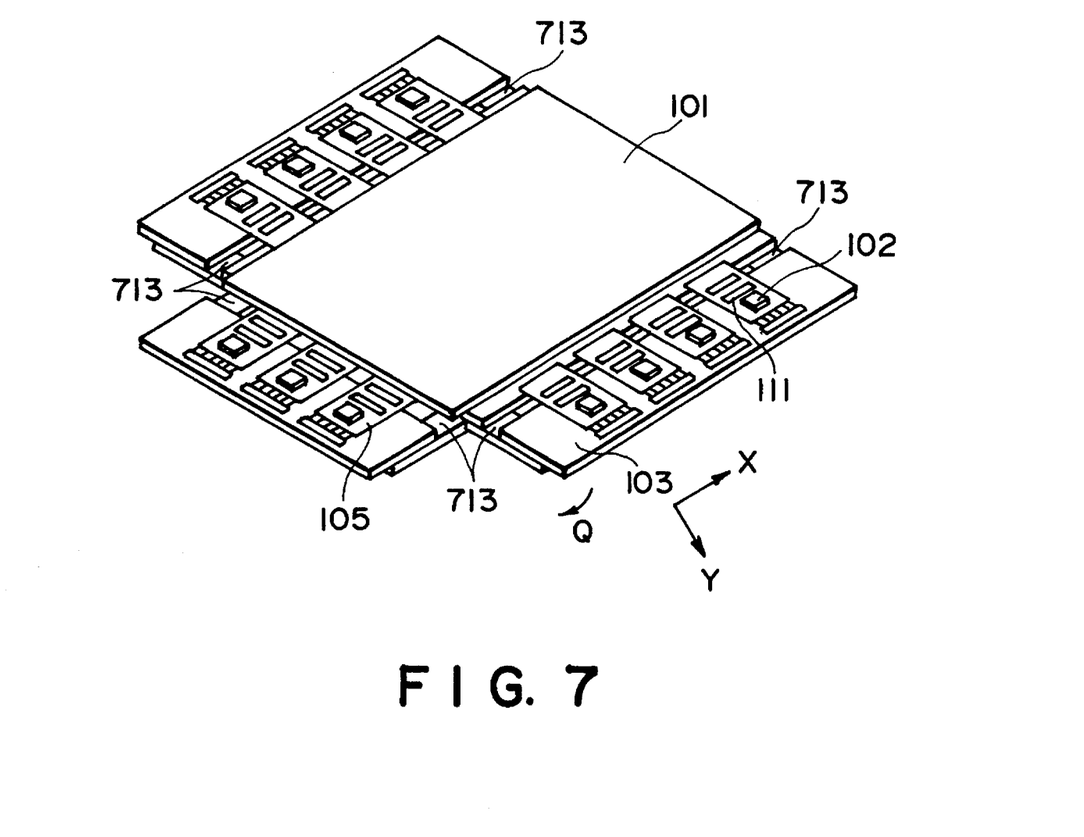
FIG. 7 is a perspective view showing a liquid crystal apparatus including a display device (panel), and drive circuits and bus substrates connected to the display device according to the first embodiment.

FIG. 7 is a perspective view showing a fourth embodiment of assembling an external drive circuit with a display device. In this embodiment, fixing members 713 are disposed to bridge between a display device 101 and bus substrates 103, e.g., by bonding. As a result, the bus substrates 103 are fixed in a planar direction with respect to the display device 101.

When a module constituted as described above is supplied with an external impact or vibration, the bus substrates are not readily dislocated in X and Y directions in FIG. 7 but are liable to be dislocated in a Q-direction (rotational direction). In this instance, by providing film carriers 105 with blanks 111, the film carriers 105 are allowed to retain a flexibility with respect to the dislocation in the Q direction, thereby preventing damages of the drive circuits 102 and electric wires.

Figure 12:
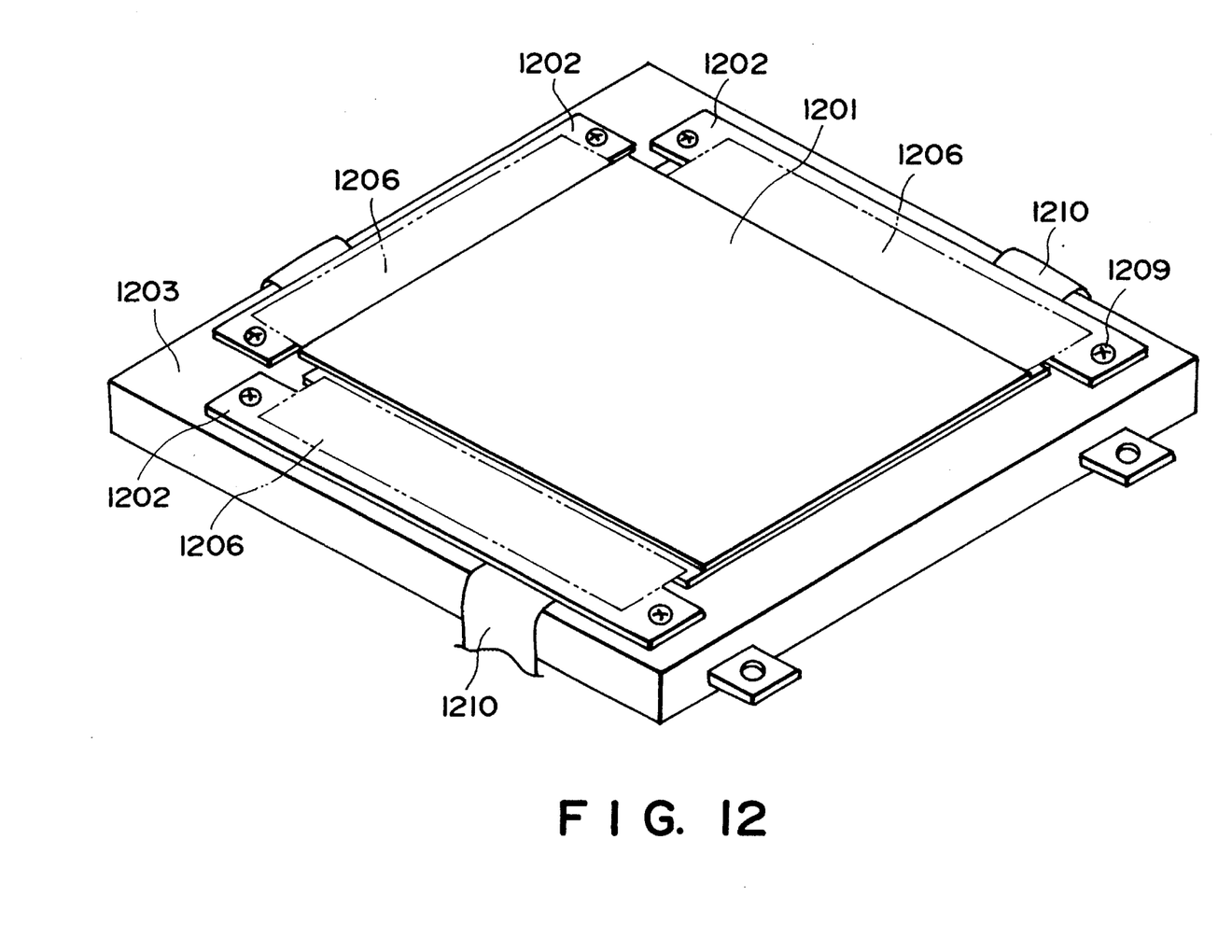
FIG. 12 is a perspective view showing a embodiment according to a second aspect of the liquid crystal apparatus according to the invention.
Figure 13:
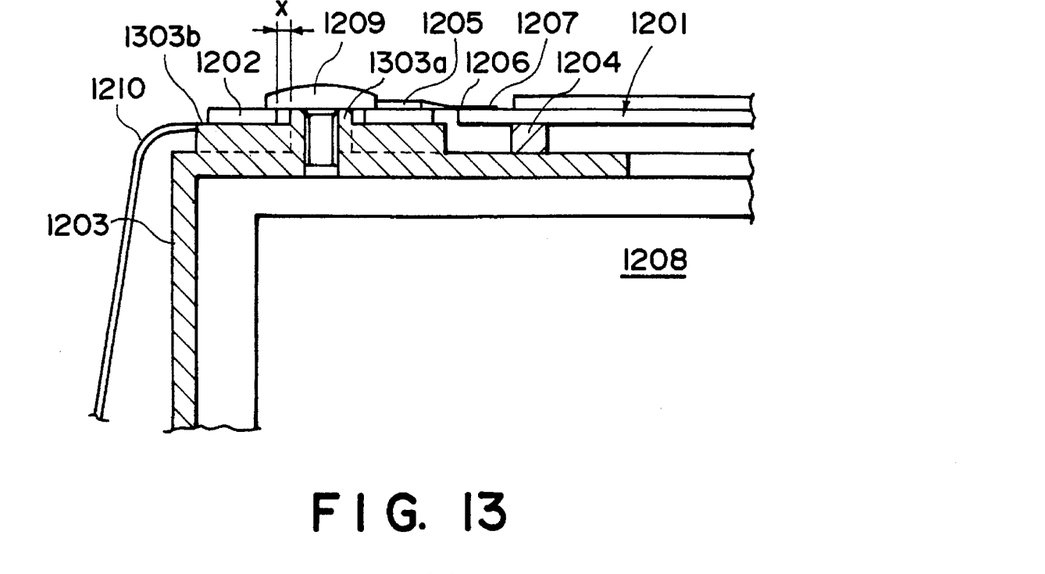
FIG. 13 is a partial sectional view corresponding to FIG. 12.

Then, a second aspect of the present invention will now be described with reference to the drawings. FIG. 12 is a perspective view showing an embodiment of the liquid crystal apparatus according to the present invention, and FIG. 13 is a sectional view showing a fixing structure where a display device is screwed to a panel fixing member. More specifically, the fixing structure includes a display device 1201, a unit substrate 1202 for supplying electricity and signals, a panel-fixing member 1203, a silicone adhesive 1204 for bonding the panel 1202, a drive IC 1205 carried on a film carrier 1206 having a lead 1207, a backlight 1208, a screw 1209 and a flat cable 1210. In this structure, at a part for fixing the unit substrate 1202 of the panel-fixing member 1203 are provided a boss 1303a (boss part) having a diameter smaller than that of a hole provided to the unit substrate 1202 for fixing the unit substrate 1202 and a rib 1303b for receiving the unit substrate 1202. Further, the screw 1209 is tightened into the boss 1303a in the form of covering the hole for fixing the unit substrate with its head.

Figure 14:
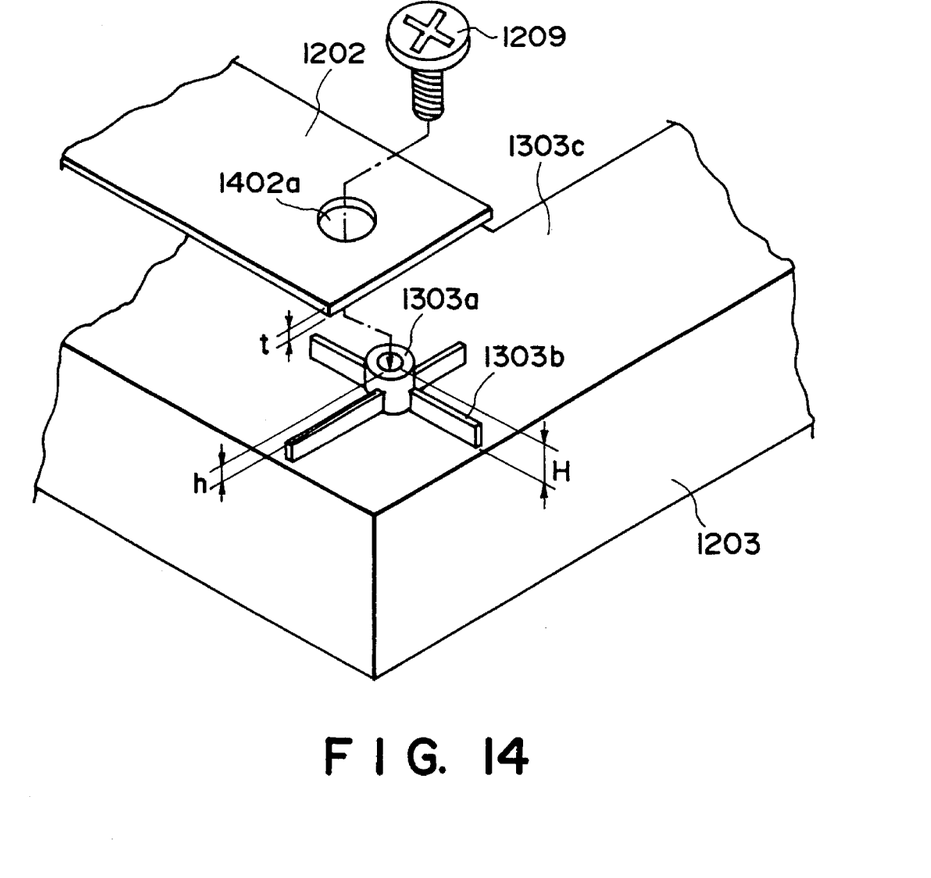
FIG. 14 is a partial exploded view corresponding to FIG. 12.

FIG. 14 is an exploded view of the fixing structure including the drive unit substrate 1202, the panel fixing member 1203 and the screw 1209 shown in FIG. 13. Referring to FIG. 14, the unit substrate 1202 is mounted on the ribs 1303b of the panel-fixing member 1203 with its lower surface and fixed by the screw 1209. In this instance, a height h measured from the upper surface of the ribs 1303b to the upper surface of the boss 1303a is set to be slightly larger, e.g., by ca. 0.1–0.2 mm than the thickness t of the unit substrate 1202. By putting the unit substrate 1202 between the screw 1209 and the panel-fixing member 1203 and tightening the screw 1209, the screw 1209 is stopped upon the upper surface of the boss 1303a and can regulate the vertical position of the unit substrate 1202 with a slight play without tightening the unit substrate 1202 per se because of the relationship of t<h.

Further, when the diameter of the fixing hole 1402a bored in the unit substrate is denoted by D and the diameter of the boss 1303a is denoted by d, there is formed a gap of (D-d)/2 between the boss 1303a and the unit substrate 1202 surrounding the hole 1402a if the fixing hole 1402a and the boss 1303a are coaxially aligned. Now, if the gap is denoted by x, the unit substrate 1202 is set movably by a distance x relative to the panel-fixing member 1203 in a planer direction parallel to the panel 1201. As a result, even if the panel 1201 causes a positional deviation y relative to the fixing member 1203 due to a change in environmental temperature or an impact, the unit substrate 1202 is not affected by the movement of the fixing member 1203 if the relative deviation y is within the range of x-y>0, so that the breakage of the leads of the film carrier 1206 can be obviated.

According to one of our experiments, a liquid crystal apparatus including a display panel 1201 having a size of 300 mm and a fixing member 1203 having a size of 370 mm respectively along one side of the apparatus caused a lead breakage when subjected to an environmental temperature change of from 25°– 60° C. The difference in elongation between the panel 1201 and the panel-fixing member 1203 at that time was about 0.6 mm. Accordingly, if the elongation occurs in equal degrees at both ends, the positional deviation y between the panel 1201 and the fixing member 1203 amounts to a half thereof, so that an adequate tolerance can be attained if x is set to satisfy x>0.3 for the above-mentioned sizes and the temperature ranges.

Based on similar analysis, it is possible to set an appropriate value of x for a fixing member 1203 having a different thermal expansion coefficient and/or a different size, so as to adequately practice the present invention.

In the above embodiment, the ribs 1303b are selected as a contacting member between the unit substrate 1202 and the fixing member 1203 so as to facilitate the relative movement therebetween, but a roughly similar good result can be obtained even if the lower surface of the unit substrate 1202 and the upper surface 1303c of the panel-fixing member 1203 contact each other.

Figure 15:
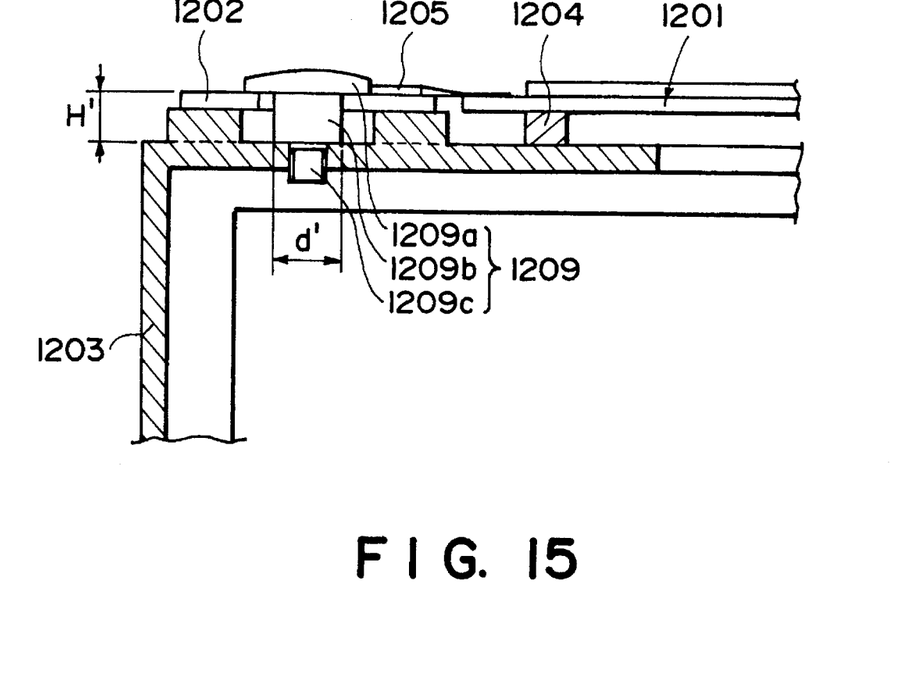
FIGS. 15–17 are respectively a partial sectional view showing a joint structure according to another embodiment of the present invention.

Modifications (1) In the above embodiment, the bosses 1303a are provided to the fixing member 1203 so as to set the unit substrate 1202 with some allowance for movement. However, if a screw 1209 is provided with a step 1209b (regulating means) between its head 1209a and thread portion 1209c, and the step 1209b is provided with a height H' and a diameter d', as shown in FIG. 15, equal to the height H and the diameter d of the boss 1303a in the above embodiment, substantially the same effect can be attained without using bosses.

Figure 16:
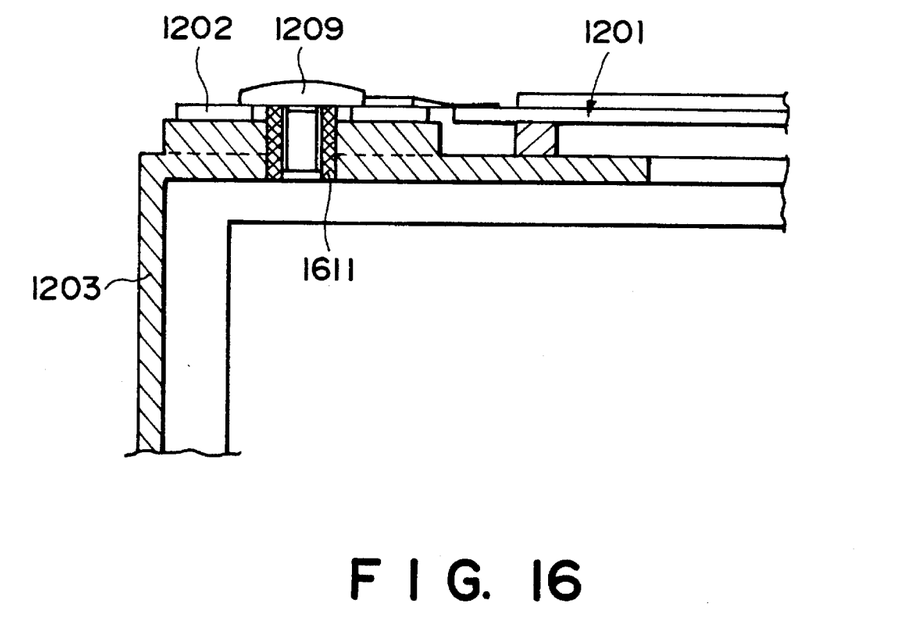

(2) In the above embodiment, the fixing member 1203 is provided with a boss 1303a so as to set the unit substrate 1202 with some allowance for movement. It is also possible to use an insert metal 1611 (regulating means) embedded within the fixing member 1203 as shown in FIG. 16 instead of the boss 1303a. By this modification, substantially the same effect as in the above embodiment can be attained while attaining a better durability of tightening and loosening of the screw 1209 than tightening the screw 1209 directly within the fixing member 1203 which is generally composed of a plastic.

Figure 17:
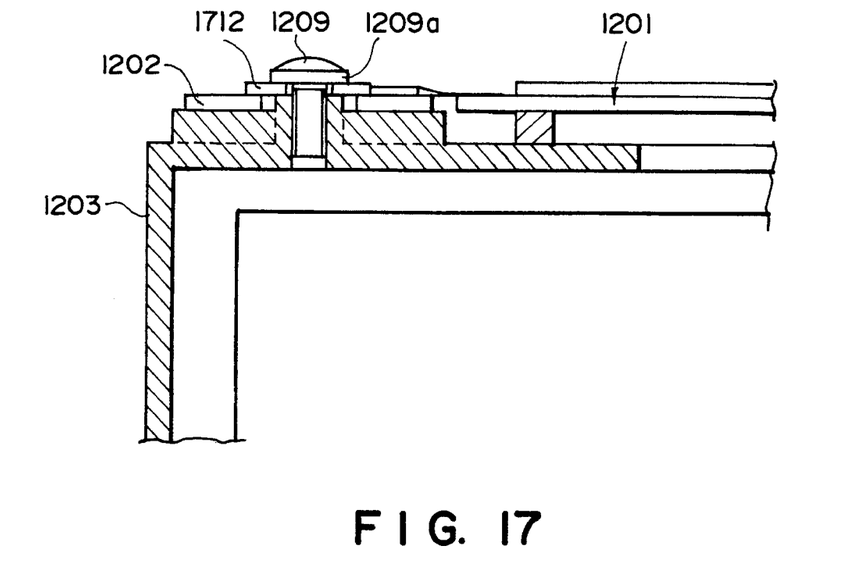

(3) In the above embodiment, the tightening of the screw 1209 is effected substantially solely by the enlarged head of the screw. This may require a difficult processing of the screw head in case where a large degree of allowance x is set. In such a case, it is possible to attain a similar effect by inserting a washer 1712 between the unit substrate 1202 and the screw head 1209a as shown in FIG. 17.

What is claimed is:

1. A display apparatus, comprising: a display device for data display, a drive circuit unit for driving the display device, a unit substrate for supplying electric signals to the drive circuit unit, and a tape-form film carrier comprising a first outer lead connected to the display device, a second outer lead connected to the unit substrate, an inner lead connected to the device circuit unit, a plurality of conductors connecting the leads, and an insulating substrate covering the conductors, wherein:

a part of the film carrier connecting the display device and the drive circuit unit is provided with a first and a second blank portion where the insulating substrate is locally removed to expose the conductors, the second outer lead connected to the unit substrate extends in a direction perpendicular to an extension direction of the first outer lead connected to the display device, and the first and second blank portions are disposed in two elongated rows in a direction perpendicular to the extension direction of the first outer lead connected to the display device.

2. An apparatus according to claim 1, wherein the unit substrate is elongated in a direction parallel to the elongated blank portions.

3. An apparatus according to claim 1, wherein said display device is a liquid crystal display device.

* * * * *